United States Patent [19]

Watanabe et al.

[11] Patent Number: 5,281,885
[45] Date of Patent: Jan. 25, 1994

[54] HIGH-TEMPERATURE STACKED-TYPE DISPLACEMENT DEVICE

[75] Inventors: Yoshiyuki Watanabe, Fukaya; Junichi Watanabe, Kumagaya; Shigeru Jomura, Tokyo; Takahiro Someji, Fukaya, all of Japan

[73] Assignee: Hitachi Metals, Ltd., Tokyo, Japan

[21] Appl. No.: 967,536

[22] Filed: Oct. 28, 1992

Related U.S. Application Data

[60] Continuation of Ser. No. 756,594, Sep. 9, 1991, abandoned, which is a division of Ser. No. 611,735, Nov. 13, 1990, Pat. No. 5,092,360.

[30] Foreign Application Priority Data

| Nov. 14, 1989 | [JP] | Japan | 1-295339 |
| Feb. 23, 1990 | [JP] | Japan | 2-043374 |
| Aug. 9, 1990 | [JP] | Japan | 2-211405 |

[51] Int. Cl.$^5$ ............................... H01L 41/08
[52] U.S. Cl. ........................... 310/328; 310/358; 310/346; 251/129.01
[58] Field of Search ............... 310/328, 323, 366, 346, 310/340, 344, 358, 363, 364; 251/129.01

[56] References Cited

U.S. PATENT DOCUMENTS

| 2,386,692 | 10/1945 | Kuenstler | 310/328 X |
| 3,068,177 | 12/1962 | Sugden | 310/328 X |
| 3,117,094 | 1/1964 | Ruup et al. | 310/328 X |
| 3,167,668 | 1/1965 | Nesh | 310/328 X |
| 3,861,852 | 1/1975 | Berger | 310/328 X |
| 4,284,263 | 8/1981 | Newcomb | 310/328 X |
| 4,570,098 | 2/1986 | Tomita | 310/328 X |
| 4,695,034 | 9/1987 | Shimizu et al. | 310/328 X |
| 5,038,069 | 8/1991 | Lukasiewicz et al. | 310/328 X |
| 5,092,360 | 3/1992 | Watanabe et al. | 310/328 X |
| 5,196,756 | 3/1993 | Kohno et al. | 310/358 X |

FOREIGN PATENT DOCUMENTS

| 58-196068 | 10/1980 | Japan . |
| 59-32040 | 9/1981 | Japan . |
| 61-127983 | 5/1983 | Japan . |
| 0245885 | 12/1986 | Japan . |
| 1601306 | 3/1986 | United Kingdom . |
| 2087660 | 5/1989 | United Kingdom . |
| 2094940 | 6/1989 | United Kingdom . |

OTHER PUBLICATIONS

*Piezoelectric Ceramics*, by Bernard Jaffe et al, Academic Press, 1971, pp. 120–125.

*Primary Examiner*—Mark O. Budd
*Attorney, Agent, or Firm*—Finnegan, Henderson, Farabow, Garrett & Dunner

[57] ABSTRACT

A flow rate control valve including a valve chest having an open end, an inflow passage and outflow passage each having one end communicating with the valve chest and the other end opened, a valve seat provided at the end of the inflow passage or outflow passage communicating with the valve chest, a sheet-like diaphragm provided to tightly close the open end of the valve chest and a stacked-type dispalcement device made of an electromechanical transducing material exhibiting the maximum value of piezoelectric distortion constant at a higher temperature range than 100° C. or above and which exerts a pressure on the diaphragm by its deformation to change the position of the diaphragm, thereby controlling the gap between the valve seat and the diaphragm.

12 Claims, 7 Drawing Sheets

HIGH-TEMPERATURE STACKED-TYPE DISPLACEMENT DEVICE

This application is a continuation of application Ser. No. 07/756,594 filed Sep. 9, 1991, now abandoned, which is a division of Ser. No. 611,735 filed Nov. 13, 1990, now U.S. Pat. No. 5,092,360.

BACKGROUND OF THE INVENTION

This invention relates to flow rate control valves which, for example, are often used to control the flow rate of gas in the semiconductor industry, and particularly to a high-temperature flow rate control valve and mass flow controller using a stacked-type displacement device as a drive source and suited to be used at higher temperatures than the normal operating temperature, and to a high-temperature stacked-type dispalcement device suitable for the use.

A conventional flow rate control valve using a stacked-type displacement device as a drive source is disclosed in, for example, Japanese Patent Laid-open Gazette No. 61-127983.

FIG. 9 is a longitudinal cross-sectional diagram of a main part of an example of the flow rate control valve, or the so-called normal open type of the prior art. Referring to FIG. 9, there is shown a main body 11 which made of, for example, stainless steel and formed in a block shape. This main body 11 has a valve chest 12 which opens upward, an inflow passage 13 communicating with this valve chest 12, and an outflow passage 14. Shown at 15 is a valve seat which is provided under the valve chest 12 and has a valve outlet 16 communicating with the outflow passage 14. Shown at 17 is a diaphragm which is made of a metal and formed to be a thin plate, or like a sheet. This diaphragm is provided to shut tightly the upper part of the valve chest 12 and for its under surface to be fixed to a valve body 18 so that the valve body faces the valve outlet 16. Shown at 19 is a housing which is made of the same material as the main body 11 and formed to be a hollow cylinder. This housing is fixed to the upper side of the main body 11 by a set metal member 20 so as to tightly close the valve chest 12. Shown at 21 is a stacked-type displacement device which has a valve stem 22 fixed to its lower end and which is inserted and set in the housing 19 so that the valve stem 22 can be made in contact with the diaphragm 17. Shown at 23 is an opening adjust screw which is mounted on the upper end of the housing 19 so that its lower end can be made in contact with the stacked-type displacement device 21 by screwing.

With the above structure, a predetermined gap is maintained between the valve seat 15 and the valve body 18, and thus a fluid such as gas is flowed from the inflow passage 13 through the valve chest 12 and valve outlet 16 to the outflow passage 14. Then, when a DC voltage is applied to the stacked-type displacement device 21, the stacked-type displacement device 21 is extended in the stacked-layer direction. Thus, the valve stem 22 is pushed downward to move the valve body 18 downward, so that the gap between the valve body 18 and the valve seat 15, or the opening of the valve outlet 16 is decreased. When the DC voltage is stopped from being applied to the stacked-type displacement device 21, the stacked-type dispalcement device 21 shrinks by the amount corresponding to the expansion by the previous voltage application. Therefore, the valve body 18 returns to the original position by the restoring force of the diaphragm 17, and the opening of the valve outlet 16 is restored to the original state. In this way, the opening of the valve outlet 16 can be adjusted by the DC voltage applied to the stacked-type displacement device 21, so as to control the flow rate of a fluid such as gas from the outflow passage 14.

The stacked-type displacement device used in the flow rate control valve will be described below.

A recently developed stacked-type displacement device, as disclosed in, for example, Japanese Patent publication Gazette No. 59-32040, is produced as follows. A binder is added to raw-material power, mixed and kneaded to produce a paste of a piezoelectric ceramic material, and this paste is formed in a thin plate, or sheet with a predetermined thickness. Then, a conductive material such as silver-palladium is coated on one surface or both surfaces of this plate, or sheet to form the internal electrodes. Several sheets of such thin plates are prepared, stacked, and pressed, and the stacked-layers plate is formed into a certain shape. this stacked, or laminated body is fired to produce an integral ceramic body and external electrodes are formed on both sides of the laminated body to complete a structure like a laminated chip capacitor. The stacked-type displacement device of this structure is excellent in the adherence between the sheet, or laminar layer of a piezoelectric ceramic material, and the internal electrode, and thus it does not deteriorate over a long period of time.

FIG. 10 shows an example of the structure of a stacked-type displacement device, which is called "the alternate electrode type." In FIG. 10, 31 represents the laminar which is made of a piezoelectric ceramic material. Positive and negative inner electrodes are alternately formed on the laminars, or layers, in turn. These laminars, or layers are stacked to form a laminated body 35. The inner electrodes 32a and 32b are formed to have respective edges to be projected or exposed to the outside on alternate sides or the laminated body and are, respectively, connected to the external electrodes 33a and 33b formed on the sides of the laminated body in the stacked direction. The external electrodes are connected through solder 37 to lead wires 36.

When positive and negative voltages are applied to the external electrodes 33a and 33b, respectively, an electric field is established between the inner electrodes 32a and 32b, so that the sheet, or laminar 31 is expanded, or displaced in the thickness direction by the longitudinal effect of the piezoelectric ceramic material.

FIG. 11 also shows another example of the stacked-type displacement device, which is called "the all surface electrode type" improved in the piezoelectric displacement efficiency (see, for example, Japanese Patent Laid-open Gazette No. 58-196068). In FIG. 11, like elements corresponding to those in FIG. 10 are identified by the same reference numerals. The inner electrodes 32a and 32b are formed on the entire surfaces of the layers, or laminars 31, and a necessary number of sheets of laminars, or layers are stacked, or laminated as above. Then, a coating 34 made of an insulating material is provided on every other edge (for example, only in the edges of inner electrodes 32b) of the inner electrodes 32a, 32b on one side of the laminated body 35 formed as above. In addition, the external electrode 33a made of a conductive material is deposited over the entire surface of the side including the coatings 34. On the other hand, the coating 34 is similarly provided on the every other edge of the remaining inner electrodes (for example, 32a) on the other side of the laminated body 35, and the external electrode 33b is deposited over the entire surface of the side including the coatings 34. The action of this device is the same as that in FIG. 10.

In the conventional flow rate control valve shown in FIG. 9, the valve body 18 resides in the valve chest 12 in which gas is flowed, and this valve body is drawn in or out of the valve outlet 16 which is provided in the valve seat 15, thereby controlling the flow rate. The valve body 18, when cutting off the gas flow, is in contact with the edge of the valve outlet 16, and when controlling the flow rate, it slides against the edge and inner peripheral surface of the valve outlet 16. Thus, friction therebetween causes metal powder due to the abrasion and this metal powder is mixed into the gas. In the normal closed type flow rate control valve, though not shown, the frequency of the contact and slide between the valve body 18 and the valve outlet 16 is considerably large as compared with the normal open type, and therefore a large amount of metal powder is caused by the abrasion, making the above problem even more serious.

Moreover, the amount of displacement of the stacked type displacement device 21 used in the conventional flow rate control valve is at least about 30 to 40 μm even if the length of the laminated body is 40 mm. Since the gas flow rate in the piezoelectric valve of this type is determined by the gap size between the valve seat 15 and the diaphragm 17, only a very small amount of flow can be controlled by the above amount of displacement. Thus, in order to realize a large flow rate controlling pieozoelectric valve, it is necessary to increase the number of layers of the laminars 31 and inner electrodes 32a, 32b which constitute the stacked-type displacement device 21. This inevitably results in a large piezoelectric valve, thus increasing the space to be occupied. Therefore, the conventional piezoelectric valve is used only for controlling a very small flow rate, and it is not suited to use for controlling a large flow rate. For a flow rate, or for controlling a wide range of flow rate, several piezoelectric valves are necessary, thus not only occupying a large space or floor area but also making the maintenance and inspection and management complicated.

In recent years, in the semiconductor manufacturing field, purer and higher-temperature reaction gas is required for use, and the instrument or apparatus for supplying the gas is desired to withstand high temepratures. When the conventional flow rate control valve is used in a high temperature range of, for example, 100° C. or above, the amount of displacement and static capacitance of the electromechanical transducing material of which the laminar 31 is made is considerably changed by temperature, so as not to properly function. In other words, because the Curie temperature (the temperature at which the piezoelectric characteristic is lost) of, for example, the common electromechanical transducing material is about 150° C., the piezoelectric distortion constant, d33 is suddenly decreased when the temperature of the device exceeds 100° C., and thus the amount of displacement is greatly decreased to far less than a necessary amount. Particularly in recent years, the use of the flow rate control valve is expanded up to the high temperature range of about 200° C., and the specification thereof becomes more severe than before. Thus, it is highly desirable to realize a flow rate control valve having a stable control function against any ambient temperature at which the device is used.

In addition, the solder 37 connecting the external electrodes 33a, 33b and the lead wire 36 can melt at the high temperature, disconnecting the electrodes and the lead wire. Moreover, in devices covered with a film of an epoxy resin (epoxy aromatic diamine, polyamine, nyron or aliphatic amine family) for increasing the strength against, for example, a high humidity atmosphere, the film can melt or peel off so that the device is easily deteriorated.

SUMMARY OF THE INVENTION

It is an object of the invention to provide a flow rate control valve suited for use at a higher temperature, which has the problems of the prior art solved, the capability of assuring the characteristics of displacement, static capacitance and so on maintained at a predetermined level, and high stability and reliability even under a high-temperature atmosphere.

It is another object of the invention to provide a mass flow controller using the above high-temperature use flow rate control valve.

It is still another object of the invention to provide a high-temperature use stacked-type displacement device which can stably make a predetermined displacement with the piezoelectric distortion constant $d_{33}$ maintained to be sufficiently a large value, and with no disconnection or other troubles even under a high-temperature atmosphere.

In order to achieve the above objects, according to a first invention, there is provided a flow rate control valve comprising a body including a valve chest having an open end and an inflow passage and outflow passage each having one end communicating with the valve chest and the other end opened, a valve seat provided at the end of the inflow passage or outflow passage communicating with the valve chest, a sheet-like diaphragm made of a metallic material and provided to tightly close the open end of the valve chest, a housing provided at the open end of the valve chest of the body, and a stacked-type displacement device provided within, wherein the stacked-type displacement device is made of an electromechanical transducing material which exhibits the maximum value of piezoelectric distortion constant $d_{33}$ at a higher temperature range than the normal temperature, and the diaphragm is formed to be driven to be made in contact with the valve seat and separated therefrom freely.

According to a second invention, there is provided a flow rate control valve of the first invention wherein heating means is provided to heat the stacked-type displacement device to a temperature at around which the electromechanical transducing material exhibits the maximum value of piezoelectric distortion constant $d_{33}$.

According to a third invention, there is provided a mass flow controller comprising a flow rate detector provided in the inflow passage or outflow passage of the flow rate control valve and control means for controlling the flow rate control valve in accordance with the output from the flow rate deteter, wherein the flow rate control valve is the high-temperature flow rate control valve of the first or second invention.

According to a fourth invention, there is provided a stacked-type displacement device including a laminated body comprising a plurality of laminas each made of an electromechanical transducing material and a plurality of inner electrodes each made of a conducting material, the laminas and the inner electrodes being alternately stacked, and a pair of external electrodes formed on the sides of the laminated body so as to be alternately connected to every other one of the inner electrodes, wherein the electromechanical transducing material exhibits the maximum value of piezoelectric constant $d_{33}$ at a higher temperature range of 100° C. or above.

According to a fifth invention, there is provided a stacked-type displacement device of the fourth invention, wherein the surface of the laminated body is covered by a film which is made of a heat-resistant insulating resin material.

According to a sixth invention, there is provided a stacked-type displacement device of the fourth invention or the fifth invention, wherein lead wires are connected to the external electrodes with solder having a liquid phase temperature of 200° C. or above.

According to a seventh invention, there is provided a stacked-type displacement device including a laminated body comprising a plurality of laminas each made of an electromechanical transducing material and a plurality of inner electrodes each made of a conducting material, the laminas and the inner electrodes being alternately stacked, and a pair of external electrodes formed on the sides of the laminated body so as to be alternately connected to every other one of the inner electrodes, wherein the electromechanical transducing material contains 61-66 weight % of PbO, 2-5 weight % of $SrCO_3$, 10.5-12 weight % of $TiO_2$, 20-22 weight % of $ZrO_2$ and 0.1-2.0 weight % of $Sb_2O_3$ and exhibits the maximum value of piezoelectric distortion constant $d_{33}$ in temperature range above 100° C.

Since the high-temperature use flow rate control valve and the mass flow controller using this valve have the construction and action as described above, the piezoelectric distortion constant $d_{33}$ of the material of which the stacked-type displacement device is made is maintained to have a sufficiently large value even when, for example, an organometallic gas of which the boilling temperature is 50 to 150° C. is used as a fluid, and therefore the diaphraghm stroke is large, thus achieving a satisfactory flow rate control. In addition, the valve seat and the diaphragm are not clogged and contaminated by the fluid, thus greatly increasing the reliability. If only the stacked-type displacement device is heated so that it is operated at a temperature at which the piezoelectric distortion constant $d_{33}$ becomes the maximum, a large diaphragm stroke than at the normal temperature or a low temperature can be achieved. Therefore, this invention can be used for the liquid at a low temperature or at the normal temperature, and thus the use can be expanded.

Moreover, since the high-temperature use stacked-type displacement device of this invention has the construction and action as described above, the piezoelectric distortion constant $d_{33}$ can be maintained to be a sufficiently large value even in a high-temperature atmosphere of 100°-250° C. and thus a predetermined displacement can be stably achieved with no disconnection or other troubles even in such an atmosphere. In addition, the reliability of the stacked-type displacement device can be greatly increased and its use can be expanded.

DESCRIPTION OF THE PREFERRED EMBODIMENTS

Figure 1:
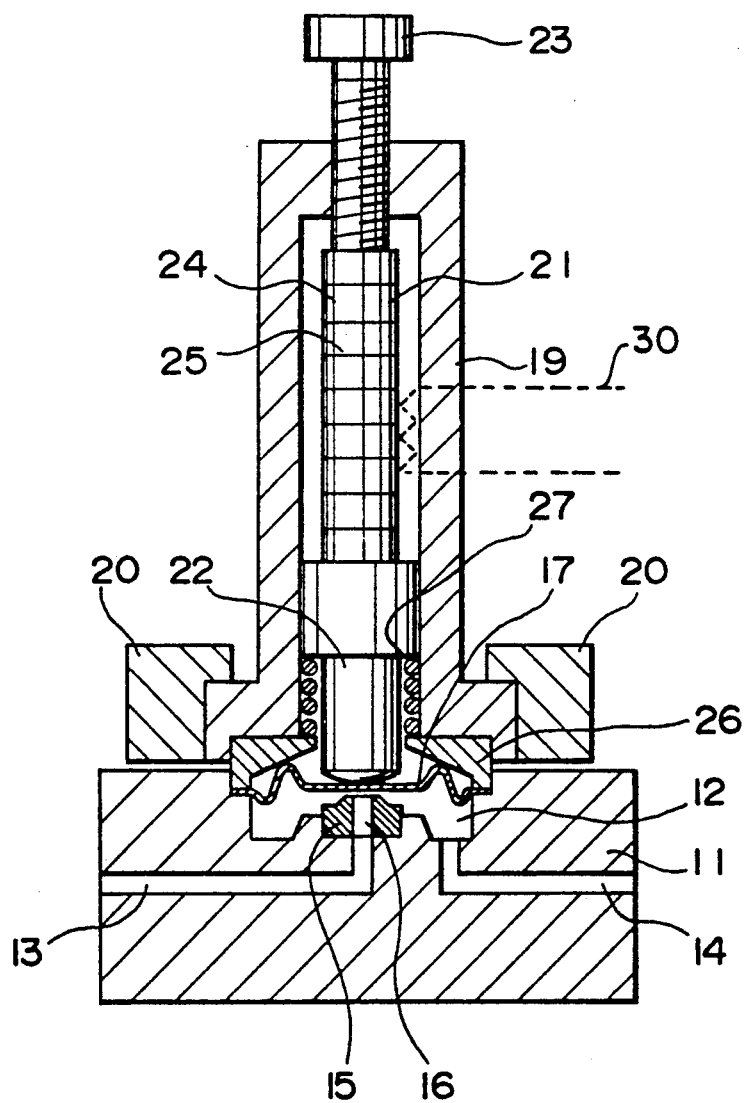
FIG. 1 is a longitudinal cross-sectional diagram of a main part of an embodiment of this invention.
Figure 9:
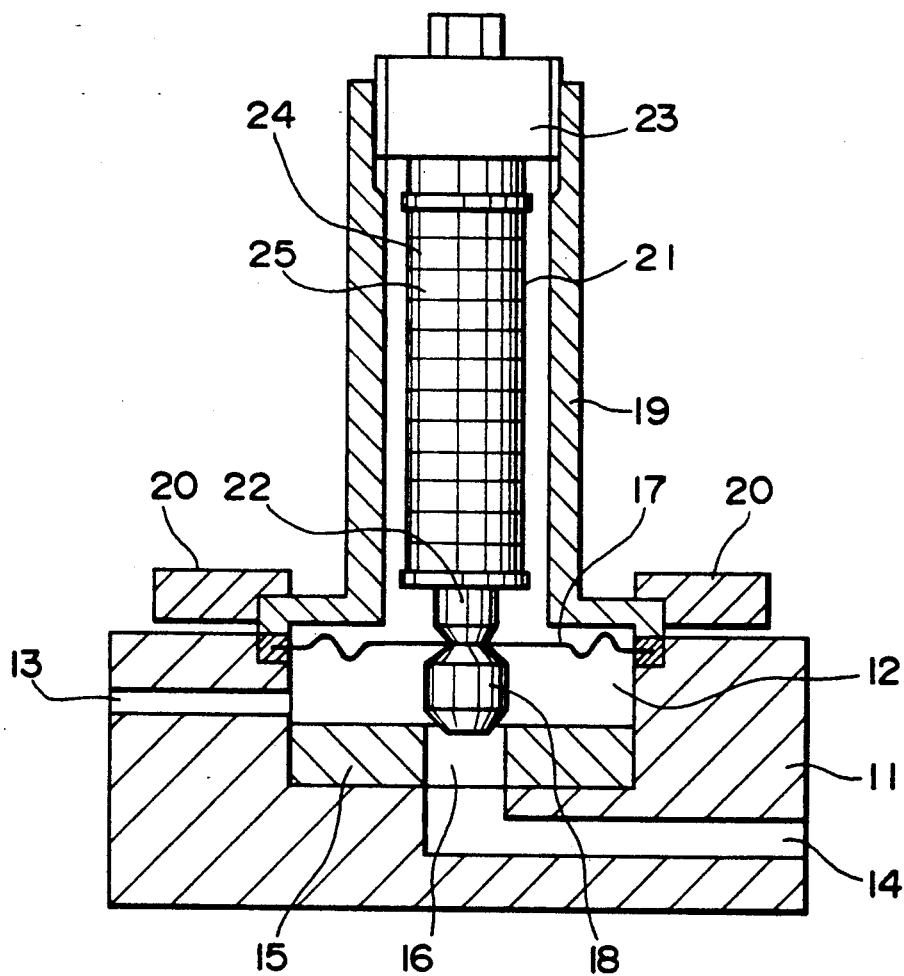
FIG. 9 is a longitudinal cross-sectional diagram of a main part of a conventional flow rate control valve.

FIG. 1 is a longitudinal cross-sectional diagram of a main part of a flow rate control valve of this invention. In FIG. 1, like elements corresponding to those in FIG. 9 are identified by the same reference numerals. Referring to FIG. 1, there are shown diaphragm setting members 26, which are provided between the housing 19 and the main body 11 so as to fix the diaphragm 17. Shown at 27 is a compression coil spring, which is interposed between the valve stem 22 and the diaphragm setting members 26 so as to press the valve stem 22 upward.

Since a predetermined distance is maintained between the valve seat 15 and the diaphragm 17 under this construction, gas is flowed from the inflow passage 13 through the valve outlet 16 and valve chest 12 to the outflow passage 14. When a DC voltage is applied to the stacked-type displacement device 21 to expand it in the laminated direction, the device presses the central portion of the diaphragm 17 through the valve stem 22 against the repulsive force of the compression coil spring 27, thereby reducing the distance between the diaphragm 17 and the valve seat 15, or reducing the opening of the valve outlet 16 to decrease the flow rate of the gas. When the voltage is stopped from being applied to the stacked-type displacement device 21, the valve stem 22 is restored to the original position by the restoring force of the compression coil spring 27, and the diaphragm 17 is also restored to the original position. Thus, the flow rate of gas can be controlled as in the conventional example shown in FIG. 9.

In the device shown in FIG. 1, since the diaphragm 17 is only contacted with and separated from the valve seat 15, sliding action is not present therebetween, thus not causing metal powder due to the abrasion. In addition, since the compression coil spring 27 is provided on the outside of the gas passage, no metal powder is produced, so that no metal powder is mixed into gas.

To the construction shown in FIG. 1, can be applied the construction which is disclosed in the Japanese Application No.1-94492 already filed by this applicant.

Figure 2A:
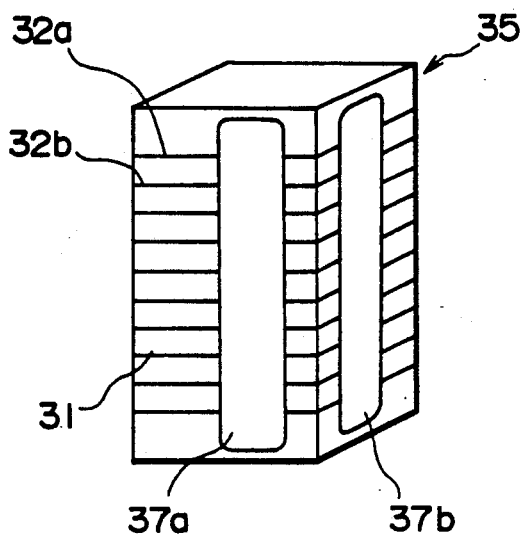
FIGS. 2A to 2D are perspective views of an example of the laminated body constituting the stacked-type displacement device in the embodiment of the invention.

FIGS. 2A to 2D are perspective views of an example of the laminated body of the stacked-type displacement device used in the embodiment of this invention. In FIG. 2A, the lamina 31 is made as follows. Row materials of PbO, $SrCO_3$, $TiO_2$, $ZrO_2$, and $Sb_2O_3$ are mixed as listed in Table 1 so as to achieve the chemical composition formular, $Pb_xSr_{1-x}Zr_yTi_{1-y}O_3 + Z_{wt}\% \ Sb_2O_3$. In Table 1, No. 6 represents a piezoelectric material of 0.5 Pb (Ni1/3 Nb2/3)O$_3$−0.35PbTiO$_3$−0.15PbZrO$_3$ which has so far been used widely for the stacked-type displacement device.

TABLE 1

| No. | x | y | z | $\epsilon_{33}^T/\epsilon_0$ | K$_{33}$ | $d_{33}$ ($\times 10^{-12}$ m/v) | Tc (°C.) |
|---|---|---|---|---|---|---|---|
| 1 | 0.9 | 0.55 | 1.5 | 3800 | 0.81 | 690 | 180 |
| 2 | 0.9 | 0.55 | 1.0 | 3300 | 0.80 | 670 | 210 |
| 3 | 0.9 | 0.55 | 0.5 | 3250 | 0.80 | 665 | 235 |
| 4 | 0.88 | 0.54 | 1.5 | 4500 | 0.77 | 710 | 160 |
| 5 | 0.92 | 0.56 | 0.5 | 2980 | 0.81 | 645 | 255 |
| 6* | — | — | — | 5500 | 0.68 | 635 | 145 |

*conventional

Generally in the flow rate control valve, the amount of displacement of the stacked-type displacement device as a drive source is required to be large, and thus the piezoelectric material to be used is required to have a large piezoelectric distortion constant d$_{33}$. The piezoelectric distortion constant d$_{33}$ is calculated from the following equation $$d_{33} = K_{33} \sqrt{\epsilon_0 \cdot \epsilon_{33}^T S_{33}^E}$$

where
$\epsilon_0$: the permittivity of vacuum
$\epsilon_{33}^T$: the relative permittivity
$S_{33}^E$: the elastic compliance
$K_{33}$: the electromechanical coupling coefficient.

In the above equation, since the elastic compliance $S_{33}^E$ of piezoelectric ceramics is about 15×10$^{-12}$m$^2$/N, and the electromechanical coupling coefficient K$_{33}$ of conventionally used materials is limited to about 0.6 to 0.7, the piezoelectric distortion constant d$_{33}$ can be increased by normally decreasing the Curie temperature Tc of the piezoelectric ceramics and increasing the relative permittivity E$_{33}^T$ at around room temperature.

Figure 2B:
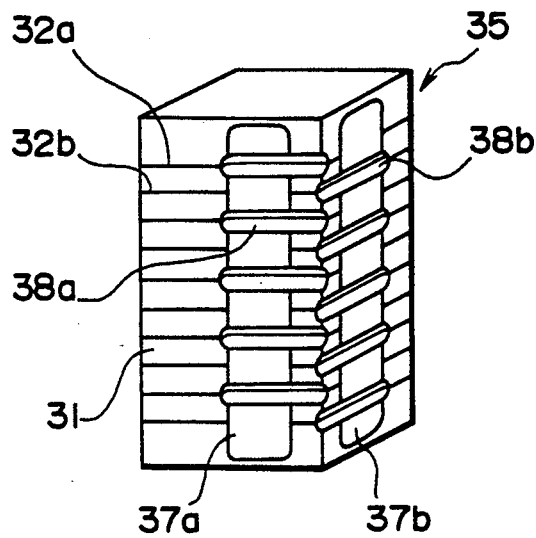
Figure 2C:
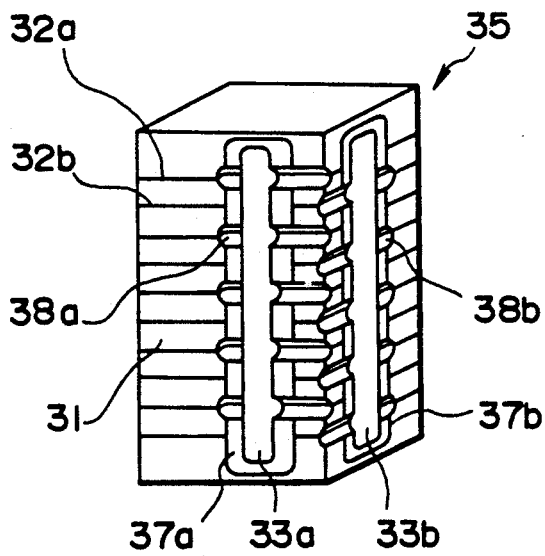
Figure 2D:
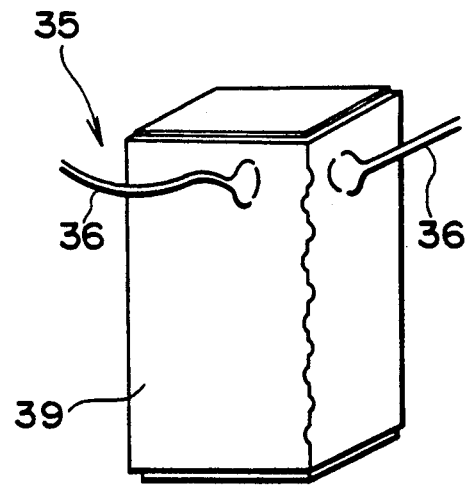

The above raw materials are mixed in a ball mill for 24 hours, and then calcinated at 800° C. for one hour. After the calcinated powder is pulverized, it is mixed with polyvinyl butyral, and dispersed in trichlene to form a slurry. Then, this mixture is used to make the sheet-like thin plates, or laminars 100 μm thick by a doctor blade. On the entire surfaces of the laminas 31 are respectively screen-printed the inner electrodes 32a and 32b with the platinum conductive paste or silver-palladium paste. For example, about 100 laminas 31 having the inner electrodes 32a, 32b are alternately laminated, or stacked one over another and pressed to form a laminated body, which is cut to be of a certain size and shape. This laminated body is heated at 500° C. so that the binder contained therein is removed. Then it is fired at 1050 to 1200° C. in the oxygen atmosphere for 1 to 5 hours and cut into pieces of a predetermined size as the laminated body 35. This laminated body 35 has a size of, for example, W×D×L=5×5×10 mm or 10×10×10 mm. Then, on the adjacent sides of the laminated body 35 are respectively provided films 37a and 37b of an insulating material to cross the inner electrodes 32a and 32b. In FIG. 2B, 38a and 38b represent grooves which are formed in the films 37a, 37b by, for example, a die set to face the inner electrodes 32a, 32b. In FIG. 2C, the external electrodes 33a and 33b are provided on the films 37a and 37b to cross the grooves 38a and 38b, so that the external electrodes 33a and 33b can be connected to the inner electrodes 32a and 32b, respectively. Then the external electrodes 33a and 33b are connected to the lead wires (through which a voltage is to be applied in operation) with solder (the wire and solder are not shown). The solder is made of 25 weight % of Sn and 75 weight % of Pb and it is in a liquid phase at 260° C. In FIG. 2D, 39 represents a film of polyimide-base resin which is provided on the surface of the laminated body 35 including the external electrodes and solder (not shown) by fluid immersion or static coating. The laminated body 35 formed as above was polarized at 1.5 kv/mm, and the characteristics were measured as listed on the table. No. 6 is the laminated body made of a conventionally used material for the comparison with the invention.

From the table, it will be seen that the Curie temperature of No. 6 conventional material is 145° C., while the piezoelectric materials of the invention, No. 1 to 5, or (Pb$_x$Sr$_{1-x}$Zr$_y$Ti$_{1-y}$O$_3$+Z$_{wt}$ % Sb$_2$O$_3$)-based material exhibits an extremely large electromechanical coupling coefficient K$_{33}$ of about 0.8 and thus has a relatively high Curie temperature Tc of 160° C. of above. Thus the laminated body is able to be used at a temperature higher than 150° C.

Figure 3:
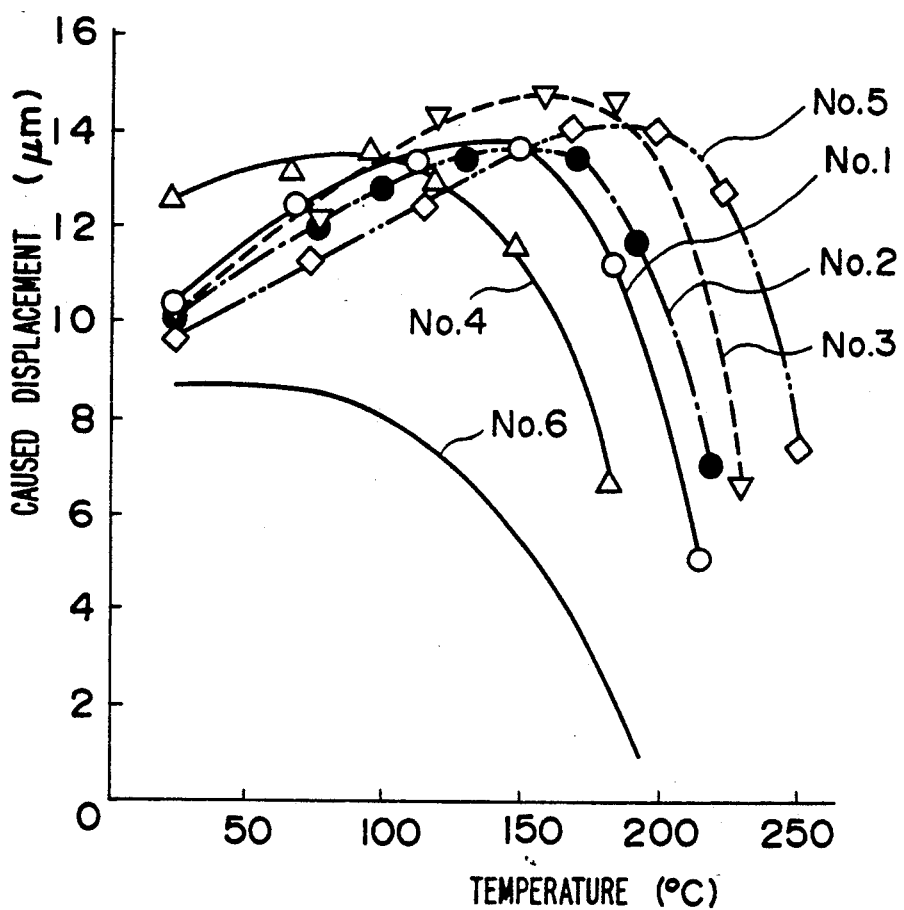
FIG. 3 shows the relation between temperature and resulting displacement.

FIG. 3 shows the relation between the temperature and the resulting displacement. In FIG. 3, like sample Nos. are the same as that in the table. The displacement (proportional to the piezoelectric distortion constant d$_{33}$) shown in FIG. 3 was caused when a voltage of 150 V was applied to the laminated body. From FIG. 3, it will be understood that in the conventional material No. 6, the caused displacement decreased with the increase in temperature and suddenly decreased at 100° C. or above. On the other hand, in the No. 1 to 5 materials of the invention, the displacement caused (, or piezoelectric distortion constant d$_{33}$) increased with the increase in temperature, and reaches a maximum of 13 to 15 μm at 100° C. or above.

Figure 10:
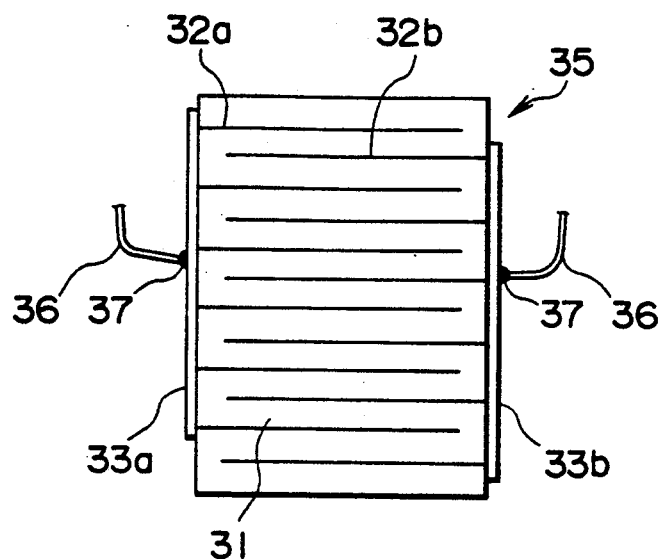
FIGS. 10 and 11 show the constructions of conventional stacked-type displacement devices.

When the laminated body of this invention was tested for the 1000-hour driving at an ambient temperature of 150° C., and a voltage of 150 V and 10 Hz, it was confirmed that of 100 samples, there was no sample of which the displacement, electromechanical material function and electrical connection became deteriorated or defective. When the conventional stacked-displacement device shown in FIGS. 10 and 11 was used in, for example, the fluid control valve actuator or automobile fuel injection valve actuator which was used at a high ambient temperature, the function of the electromechanical transducing material of the laminas 31 was deteriorated. This is due to the sudden decrease of the piezoelectric distortion constant as described above.

Moreover, four laminated bodies (W×D×L=5×5×10 mm) each of the materials 1-5 of the invention as described above were stacked and bonded with a polyimide-based adhesive to form a stacked-type displacement device 40 mm long. This stacked-type displacement device was incorporated within the flow rate control valve shown in FIG. 1 and the temperature dependency of the flow rate was measured. In this case, N$_2$ gas was used as the fluid and the outer diameter of the contact area of the valve seat with the diaphragm 17 and the inner diameter of the outlet 16 were, respectively, 2.2 mm and 2.0 mm. In other words, a DC voltage of 150 V was first applied to the stacked-type displacement device 21, and while N$_2$ gas was being flowed (difference pressure 3 kg/cm$^2$), the opening adjust screw 23 was screwed downward and the diaphragm 17 was made to contact with the valve seat 15 through the valve stem 22 so that $N_2$ gas flow rate was adjusted to be 0. Then, when the DC voltage was removed from the stacked-type displacement device 21, the compression coil spring 27 pushed the valve stem 22 upward by its repulsive force, thus separating the diaphragm 17 upward from the valve seat 15 to open the valve outlet 16. At this time, the $N_2$ gas flow rate became the maximum value.

Figure 4:
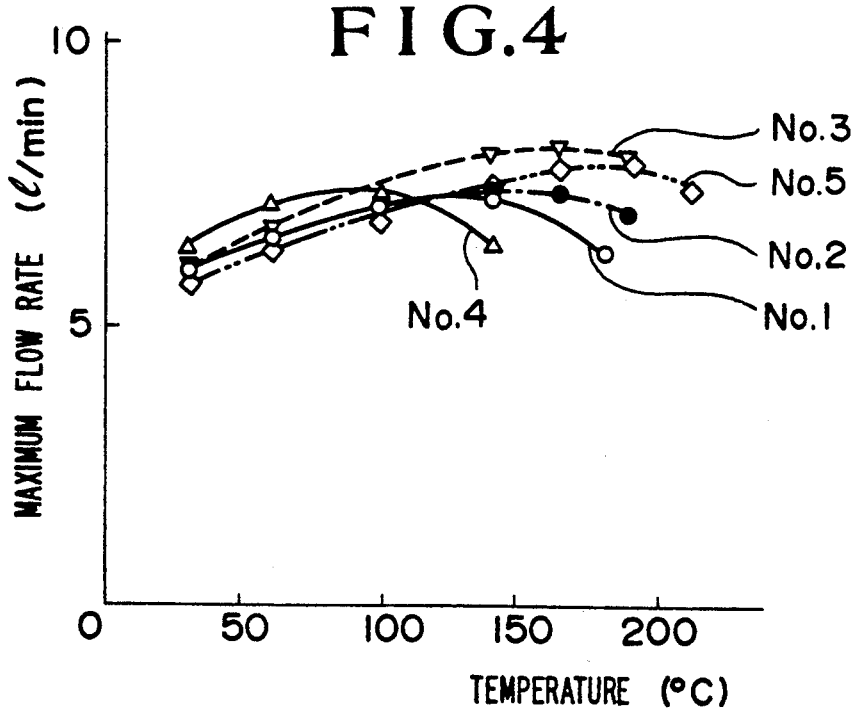
FIG. 4 shows the relation between temperature and maximum flow rate.

FIG. 4 shows the relation between the temperature and the maximum flow rate. In FIG. 4, like sample numbers No. corresponding to those in FIG. 3 indicate the same samples. From FIG. 4, it will be seen that in each sample number No. the maximum flow rate is increased with the increase of temperature and becomes reaches the maximum value at a high temperature from 130 to 180° C. In other words, the stroke of the diaphragm 17 shown in FIG. 1 increases at a high temperature in the temperature range. This is caused by the fact that the displacement of the stacked-type displacement device 21 is large and reaches the maximum value at a high temperature in the temperature range, or by the temperature dependency of the displacement shown in FIG. 3. This characteristic cannot be achieved by the conventional piezoelectric material and is effective for the organometallic gas flow rate control valve. In other words, since the organometallic gas has a high boiling point (for example, dimethyl zinc 44° C., tetramethyl tin 78° C., triethyl gallium 142.6° C.), it is necessary to heat the feed pipe system and maintain it at a temperature. As a necessity, the flow rate control valve is also used at a high temperature.

Figure 5:
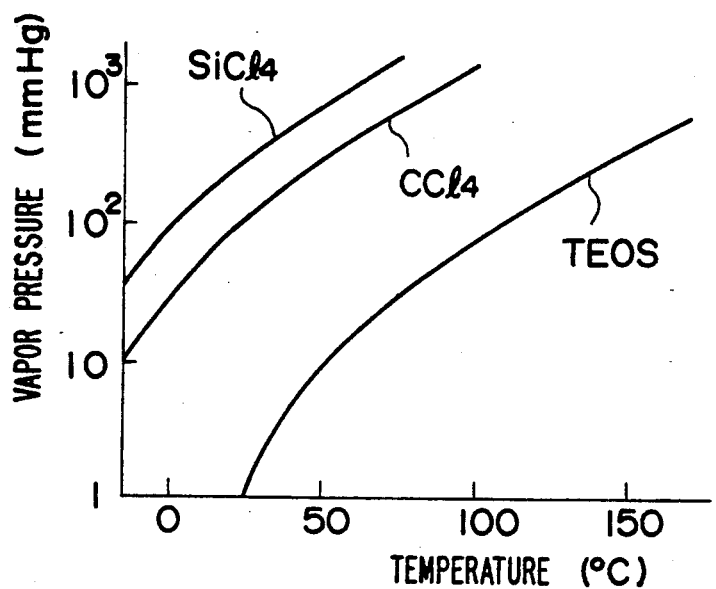
FIG. 5 shows the relation between the temperature and vapor pressure of organometallic gas.

FIG. 5 shows the relation between the temperature and vapor pressure of organometallic gases. The respective organometallic gases are flowed in the pipe by the vapor pressure, and the vapor pressure of the organometallic gases increases with the increase of temperature as shown in FIG. 5.

The gas flow rate is also increased with the increase of vapor pressure. In the conventional device of which the displacement tends to decrease with the increase of temperature, the stroke of the diaphragm 17 in FIG. 1, for instance, is decreased, and thus a sufficient flow rate cannot be obtained so that if a film is being deposited by CVD under reduced pressure, a sufficient amount of gas cannot be fed. As a result, it takes a long time to produce the film, which fact makes mass production difficult and increases the possibility that an impurity is mixed into the film.

Figure 6:
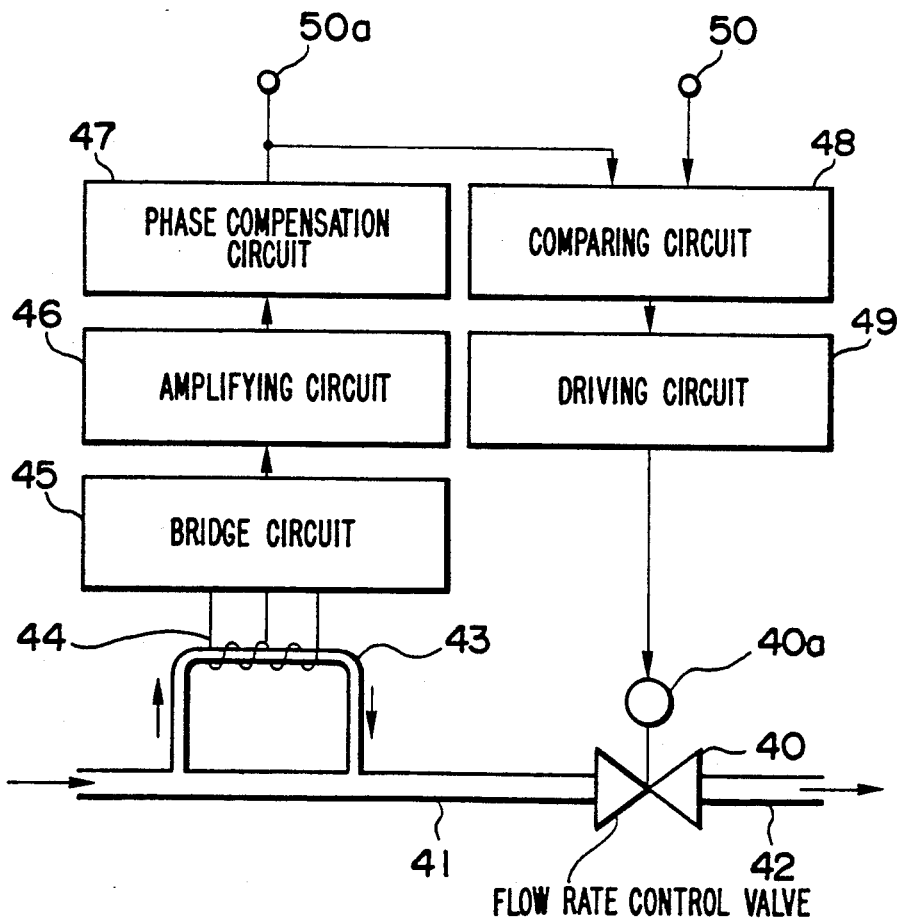
FIG. 6 shows the arrangement of a main part of another embodiment of the invention.

FIG. 6 shows the arrangement of a main part, of another embodiment of this invention, or an example of the mass flow controller for organometallic gas. In FIG. 6, there is shown a flow rate control valve 40, which is constructed as, for example, shown in FIG. 1 and in which the stacked-type displacement device 21 for drive is made of the No. 3 material in the above table. Shown at 41 and 42 are an inflow passage and an outflow passage in which a fluid flows in the arrow-direction. Shown at 43 is a flow rate sensor bypass passage, which is connected to the inflow passage 41 in, for example, a U-shape. The fluid rate in the bypass passage 43 is, for example, 10% of the whole flow. Shown at 44 is a measuring element, which is wound on the flow sensor 43, and electircally connected to a bridge circuit 45. Shown at 46, 47, 48 and 49 are an amplifying circuit, a phase compensation circuit, a comparing circuit and a drive circuit, respectively, which are connected in series with the bridge circuit 45 and which are formed to be able to transmit the output signal from the bridge circuit 45 in the serial direction. Shown at 50 is a setting signal output portion, which is connected to the comparing circuit 48. The output voltage from the drive circuit 49 is supplied to a stacked-type displacement device 40a constituting the flow rate control valve 40.

With this arrangement, when a signal of, for example, 0 to 5 V is supplied from the setting signal output portion 50 to the comparing circuit 48, a DC voltage associated with this signal is supplied through the drive circuit 49 to the stacked-type displacement device 40a, opening the valve outlet 16 as shown in FIG. 1 to allow the fluid to flow as indicated by the arrows in FIG. 6. The flow rate of the fluid can be measured by detecting the output signal which is fed from the bridge circuit 45 connected with the measuring element 44 wound on the flow rate sensor bypass passage 43 to the output portion 50a via the amplifying circuit 46 and the phase compensation circuit 47. This signal is also supplied to the comparing circuit 48 where it is compared with the setting signal, and the compared signal is supplied through the drive circuit 49 to the flow rate control valve 40, thus controlling the opening of the valve.

Figure 7:
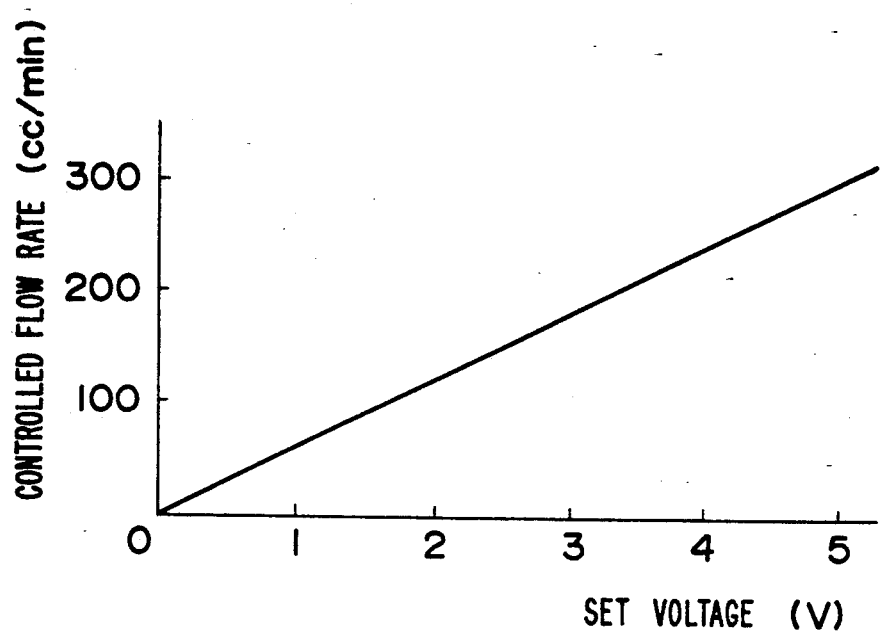
FIG. 7 shows the relation between set voltage and controlled flow rate.

FIG. 7 shows the relation between the setting voltage and the controlled flow rate. This relation is the result of controlling the flow rate of triethyl gallium gas (TEG) by the mass flow controller shown in FIG. 6. In this case, the mass flow controller was heated at 160° C. and the difference pressure of gas was the vapor pressure of TEG. From FIG. 7, it will be seen that the setting voltage is in direct proportion to the controlled flow rate. Also, since the stroke of the diaphragm (represented by 17 in FIG. 1) of the flow rate control valve constituting the mass flow controller can be increased, the valve can be prevented from being clogged and choked by dust and the flow rate can be sufficiently increased under a low difference pressure.

Figure 8:
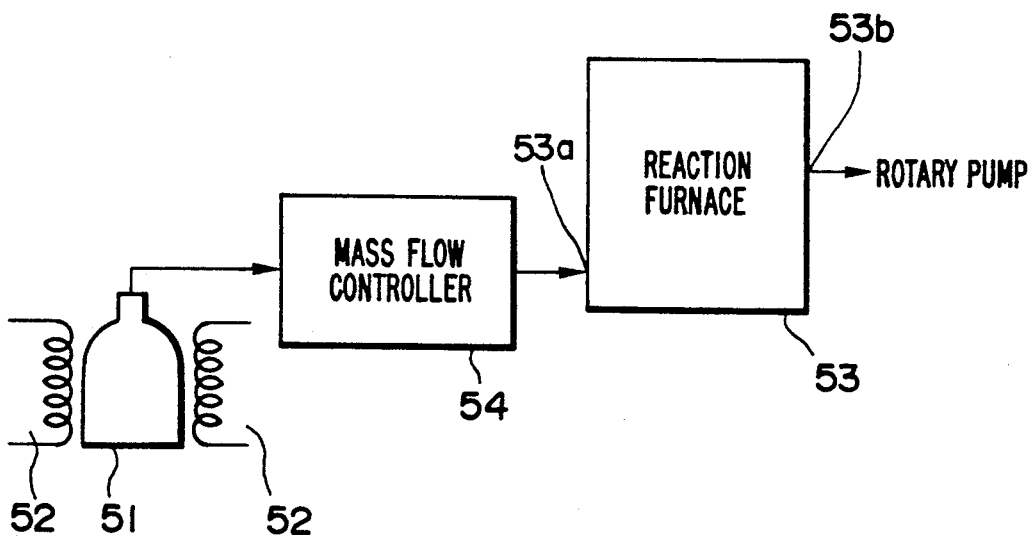
FIG. 8 is an explanatory diagram useful for explaining a main part of a pressure-reduced CVD in still another embodiment of the invention.

FIG. 8 schematically shows the arrangement of a main part of a reduced-pressure CVD in still another embodiment of the invention. In FIG. 8, there are shown a heating chamber 51 in which TEOS (tetraethoxyisilane) is placed, and a heating heater 52 which surrounds the heating chamber 51. Shown at 53 is a reaction furnace of which the primary side 53a is connected through a mass flow controller 54 shown in FIG. 6, to the heating chamber 51, and of which the secondary side 53b is connected to a rotary pump (not shown).

All the pipe system (including the mass flow controller 54) from the heating chamber 51 to the reaction furnace 53 is heated to 150° C.

A glass substrate was placed in the reaction furnace 53 and heated to 300° C. and the secondary side 53b of the reaction furnace 53 was reduced in its pressure to $10^{-3}$ Torr, so that an $SiO_2$ film was formed on the glass substrate. For the purpose of comparison, the same film as above was formed through the conventional mass flow controller and the results are listed in Table 2.

TABLE 2

| Evaluation items | Mass flow controller | |
|---|---|---|
| | Invention | Prior art |
| Working temperature (°C.) | 150 | 80 |
| Vapor Pressure (mmHg) | 450 | 40 |
| Maximum flow rate (cc/min) | 2500 | 300 |
| Film deposition speed (μm/time) | 7~8 | 2~3 |

From Table 2, it will be seen that if the mass flow controller 54 shown in FIG. 8 is a conventional one, the working temperature of the piezoelectric device as a drive source is limited to 80° C. for its characteristics, and that the vapor pressure and the maximum flow rate are 40 mmhg and 300 cc/min, respectively. On the other hand, if the mass flow controller according to this invention is used, the working temperature is 150° C., and the stroke of the valve reaches the maximum at around this temperature. Thus, the maximum flow rate is as high as 2500 cc/min at a vapor pressure of 450 mmhg. As a result the film depositing speed in the prior art is 2 to 3 μm/time, while that in the invention is as large as 7 to 8 μm/time.

Figure 11:
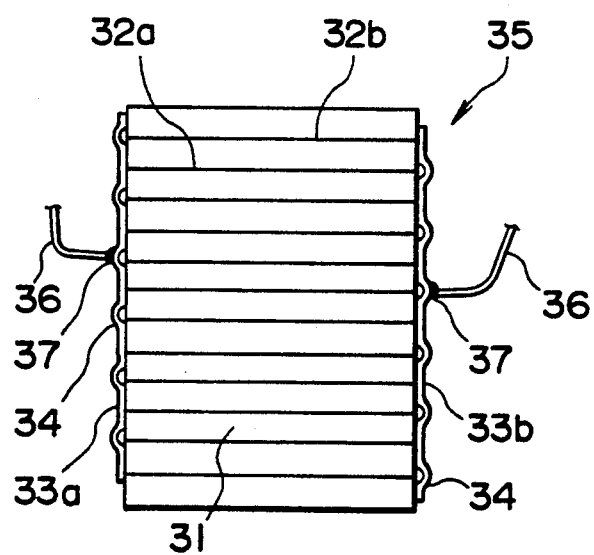

While in this embodiment the whole flow rate control valve is heated, only the stacked-type displacement may be heated by a heating coil (depicted schematically as 30 in FIG. 1) The heater may utilize the heat which the fluid itself possesses. The flow rate control valve need not be the normal-open type, but may be of the normal-closed type. The fluid to be controlled is not limited to gas, but may be a liquid. Moreover, the fluid is not limited to a high-temeprature fluid, but may be a low-temperature or a normal-temperature fluid. In addition, the stacked-displacement device is not limited to the whole-surface electrode type device as shown in FIGS. 2 and 11, but may be the so-called alternate electrode type device or other-type device in which the laminas have the inner electrodes provided on both sides and are stacked or bonded. The shape of the laminas and the inner electrodes as viewed from the top is not limited to a rectangular shape, but may be a square, circular, elliptic or other geometrical shape. Also, to make a larger displacement, a plurality of such devices can be bonded with a heat resistant adhesive. Moreover, the lead wire is not used, but lead members can be fixed to the upper and lower ends of the lamianted body. While in the above embodiment the inner electrodes and external electrodes are formed by screen printing, they may be formed by other means such as plating, evaporation, or coating. In addition, while in the above embodiment the electromechanical transducing material causes the largest displacement, or the maximum value of piezoelectric distortion constant $d_{33}$, at about 150° C., other materials having different constituents may be selectively used which cause the maximum displacement at other temperatures of up to 250° C. when considering the working temperature of the stacked-type displacement device.

While in this embodiment polyimide resin is used as a heat resistant resin, other resins having heat resistance to 200° C. or above such as epoxy phenol, epoxy novolak, silicone denatured silicone, polybenzimidazole or fluoresin may of course be used.

We claim:
1. A stacked-type displacement device including:
   (a) a laminated body comprising a plurality of laminas made of an electromechanical transducing material exhibiting a maximum value of piezoelectric distortion constant in the temperature range 100° C. or above and a plurality of inner electrodes made of a conducting material, said laminas and said inner electrodes being alternately stacked; and
   (b) a pair of external electrodes formed on the sides of said laminated body so as to be connected to every other ones of said inner electrodes, wherein said electromechanical transducing material consists essentially of 61–66 weight % of PbO, 2–5 weight % of $SrCO_3$, 10.5–12 weight % of $TiO_2$, 20–22 weight % of $ZrO_2$ and 0.1–2.0 weight % of $Sb_2O_3$.

2. The stacked-type displacement device according to claim 1, wherein substantially its entire surface is covered by a film which is made of a heat resistant insulating resin material.

3. The stacked-type displacement device according to claim 1, wherein said external electrodes include lead wires connected with solder having a liquid phase temperature of 200° C. or above.

4. The stacked-type displacement device according to claim 1, wherein the temperature range is between about 130° C. and 180° C.

5. The stacked-type displacement device as in claim 1 wherein said laminated body consists essentially of said laminas and said inner electrodes.

6. The stacked-type displacement device according to claim 1 wherein said electromechanical transducing material has a Curie temperature $T_c \geq 160°$ C.

7. A stacked-type displacement device including:
   (a) a laminated body comprising a plurality of laminas made of an electromechanical transducing material exhibiting a maximum value of piezoelectric distortion constant in the temperature range 100° C. or above and a plurality of inner electrodes made of a conducting material, said laminas and said inner electrodes being alternately stacked; and
   (b) a pair of external electrodes formed on the sides of said laminated body so as to be connected to every other ones of said inner electrodes, further including means for heating said laminated body to said temperature range.

8. The stacked-type displacement device according to claim 7, wherein substantially its entire surface is covered by a film which is made of a heat resistant insulating resin material.

9. The stacked-type displacement device according to claim 7, wherein said external electrodes include lead wires connected with solder having a liquid phase temperature of 200° C. or above.

10. The stacked-type displacement device according to claim 7, wherein the temperature range is between about 130° C. and 180° C.

11. The stacked-type displacement device according to claim 7 wherein said laminated body consists essentially of said laminas and said inner electrodes.

12. The stacked-type displacement device according to claim 7 wherein said electromechanical transducing material has a Curie temperature $T_c \geq 160°$ C.

* * * * *